United States Patent [19]

Leitch

[11] Patent Number: 4,816,783

[45] Date of Patent: Mar. 28, 1989

[54] METHOD AND APPARATUS FOR QUADRATURE MODULATION

[75] Inventor: Clifford D. Leitch, Coral Springs, Fla.

[73] Assignee: Motorola, Inc., Schaumburg, Ill.

[21] Appl. No.: 141,757

[22] Filed: Jan. 11, 1988

[51] Int. Cl.⁴ .............................................. H03C 1/00
[52] U.S. Cl. ...................................... 332/41; 332/48; 375/39
[58] Field of Search ................... 332/31 R, 41, 42, 48; 455/59, 60, 95, 108; 375/39

[56] References Cited

U.S. PATENT DOCUMENTS

| | | | |
|---|---|---|---|
| 2,960,573 | 11/1960 | Hodgson et al. | 179/15 |
| 3,082,296 | 3/1963 | Caruthers | 370/20 |
| 3,511,936 | 5/1970 | Saltzberg | 370/20 |
| 3,514,701 | 5/1970 | Palatinus | 370/20 |
| 3,821,798 | 6/1974 | Cannon | 370/74 |
| 4,313,211 | 1/1982 | Leland | 455/139 |
| 4,398,216 | 8/1983 | Field et al. | 370/20 |
| 4,521,878 | 6/1985 | Toyonaga | 455/60 X |
| 4,626,803 | 12/1986 | Holm | 332/9 R |
| 4,675,619 | 6/1987 | Uchibori et al. | 332/31 R |
| 4,680,777 | 7/1987 | Saha | 375/53 |
| 4,696,017 | 9/1987 | Masheff et al. | 375/60 |

Primary Examiner—Eugene R. LaRoche
Assistant Examiner—Robert J. Pascal
Attorney, Agent, or Firm—Daniel K. Nichols

[57] ABSTRACT

A quadrature amplitude modulation system utilizes two subcarrier signals, each quadrature modulated with information signals which are quadrature modulated onto the RF carrier. This provides a hole in the center of frequency spectrum, permitting carrier and bit sync signals can be provided in the center area of the signal spectrum.

11 Claims, 6 Drawing Sheets

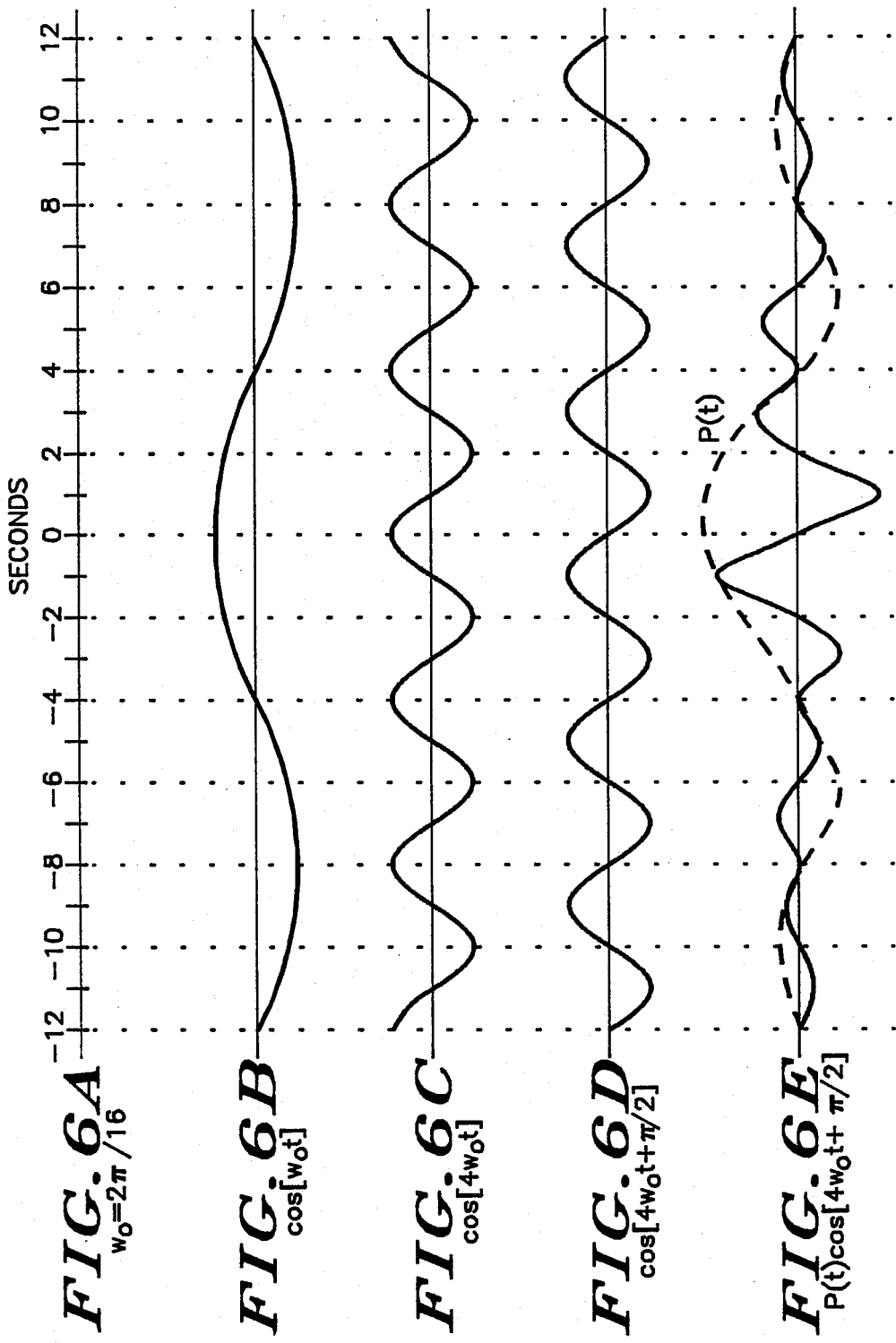

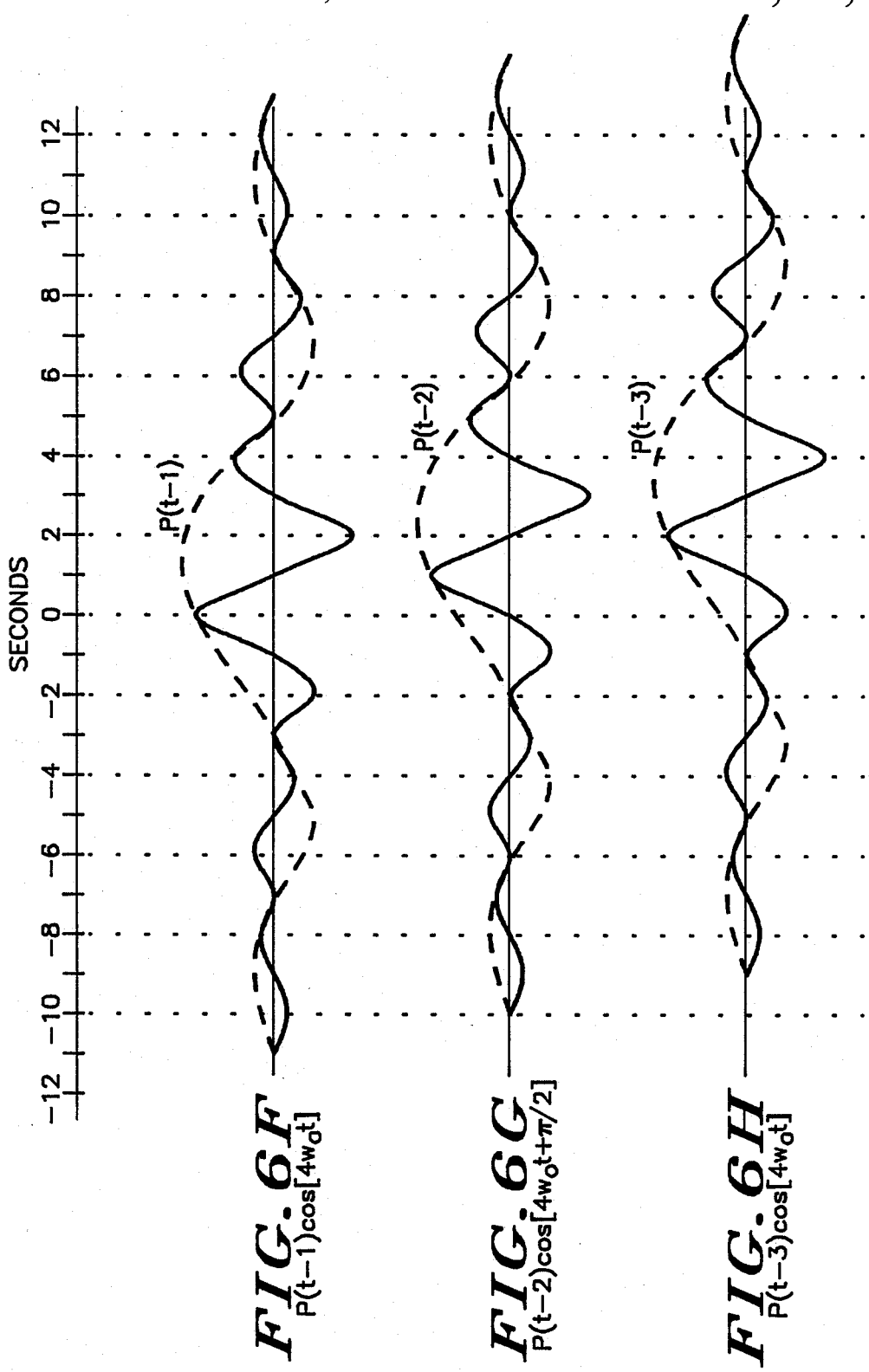

METHOD AND APPARATUS FOR QUADRATURE MODULATION

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

This invention relates to quadrature amplitude modulation systems in general and particularly to a system in which signal components are modulated unto a subcarrier to allow for inclusion of carrier and bit sync information at the center of the transmitted frequency spectrum. In a quadrature modulation system, designed for radio transmission, it is desirable to transmit a pilot carrier in order to facilitate reception and decoding of the transmitted information. While it is known to transmit a pilot carrier, such carriers have been added as a side frequency to the quadrature amplitude modulated signal. There are, however, limitations and disadvantages to this approach. Due to selectively fading, such as can occur on a radio path, problems can result where the pilot carrier is spaced from the signal information. Additionally, problems can occur due to limitations in the passband of receivers i that the pilot carrier signal may fall too close to or outside of receiver's passband filter edge. Consequently, it is desirable that such a pilot carrier be located more centrally to the transmitted frequency spectrum.

Where digital information is to be transmitted in a synchronous manner, channel fading and noise can prevent the maintenance of bit sync. In such a system it is therefore desirable to transmit a bit sync signal with the synchronous digital information. Like the pilot carrier, the bit sync signal should be provided as close to the center of the transmitted frequency spectrum as possible.

SUMMARY OF THE INVENTION

This method and apparatus for a quadrature amplitude modulation permits the inclusion of both the carrier pilot and bit sync signals at and adjacent to the center of the signal spectrum.

A method of transmitting a quadrature amplitude modulated signal including the steps of: quadrature modulating first and second signals onto a subcarrier; quadrature modulating third and fourth signals onto a subcarrier; quadrature modulating the first and second quadrature modulated subcarriers onto a carrier; and tranmitting the quadrature modulated carrier.

In one aspect of the invention, the method includes the further step of providing a DC component with one of the quadrature modulated subcarrier to produce a pilot carrier. In another aspect of the invention, the method includes the further step of providing a bit sync signal with one of said quadrature modulated subcarriers. In still another aspect of the invention, the signals are digital signals having a predetermined bit rate and the bit sync signal has a frequency that is an integral submultiple of the bit rate.

In still another aspect of the invention, a method of transmitting a quadrature amplitude modulated signal includes the steps of reading from memory first and second prototype pulses each including a subcarrier component, summing the first and second prototype pulses to produce a first quadrature modulated subcarrier, reading from memory third and fourth prototype pulses each including a subcarrier component, summing said third and fourth prototype pulses to produce a second quadrature modulated subcarrier, quadrature modulating a carrier with said first and second quadrature modulated subcarriers and transmitting the quadrature modulated carrier.

BRIEF DESCRIPTION OF THE DRAWINGS

FIG. 6A is a time line normalized for 1 bit per second.

FIG. 6B is a graphical representation of the offset oscillator output cos $(w_0t)$.

FIG. 6C is a graphical representation of the frequency quadrupler output or subcarrier cos $(4w_0t)$.

FIG. 6D is a graphical representation of the phase shifter output or quadrature subcarrier cos $(4w_0t+Pi/2)$.

FIG. 6E is a graphical representation of the S2 channel pulse P(t) modulated on the quadrature subcarrier of FIG. 6D.

FIG. 6F is a graphical representation of the S1 channel pulse P(t−1) modulated on the subcarrier of FIG. 6C.

FIG. 6G is a graphical representation of the S4 channel pulse P(t−2) modulated on the quadrature subcarrier of FIG. 6D.

FIG. 6H is a graphical representation of the S3 channel pulse P(t−3) modulated on the subcarrier of FIG. 6C.

DESCRIPTION OF THE PREFERRED EMBODIMENT

Figure 1:
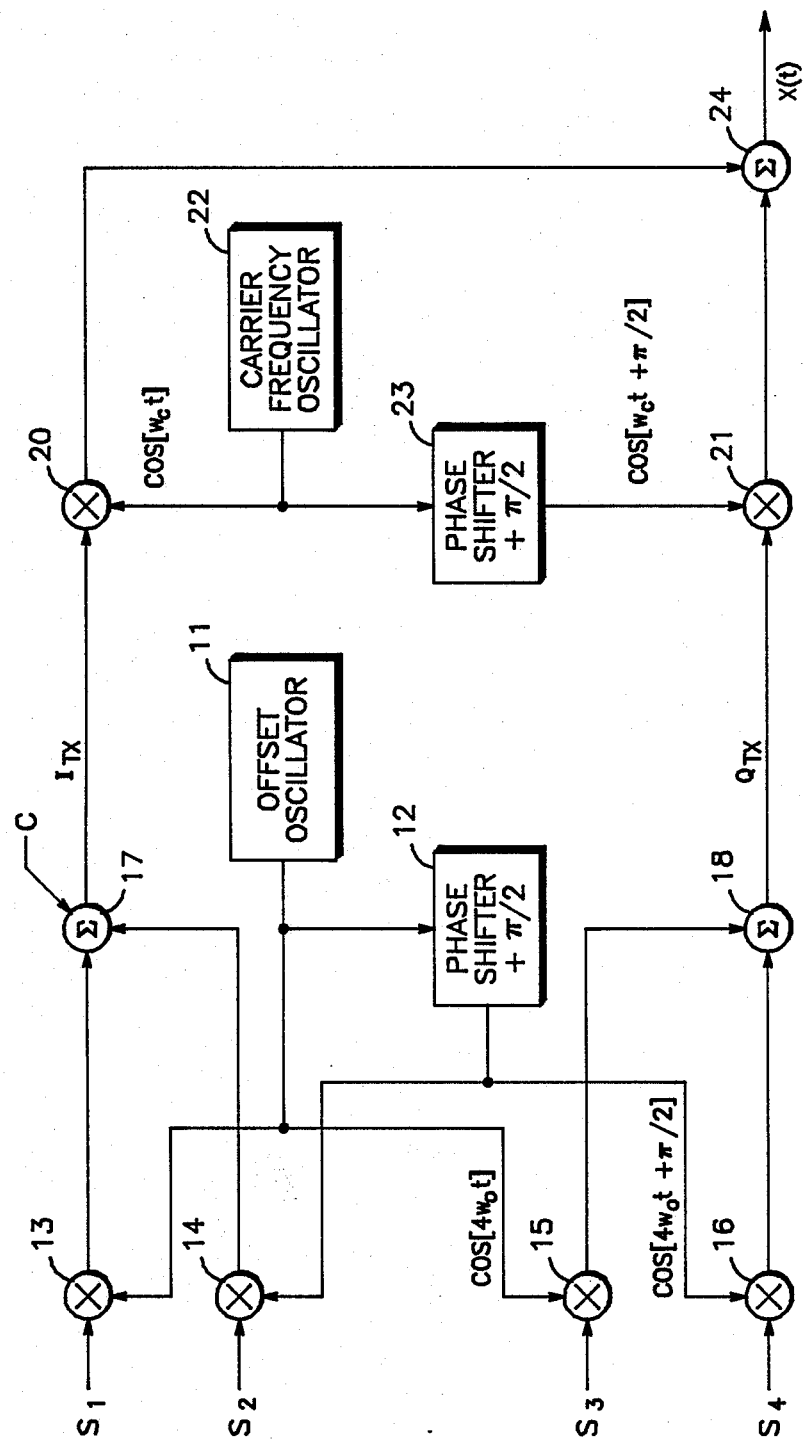
FIG. 1 is a block diagram of a quadrature amplitude modulation system in accordance with the present invention, particularly suitable for the transmission of analog signals.

Referring now by characters of reference to the drawings and first to FIG. 1, a quadrature modulation system is shown which is capable of providing a pilot carrier signal in the center of the signal spectrum. Four input signals S1-S4 which can be independent analog and/or digital signals are combined. This particular system is most suitable for analog signals as no provision is made for insertion of bit sync information.

An offset oscillator 11 is used to provide a subcarrier signal cos$[w_0t]$. Its output is also provided to a 90 degree phase shifter 12 which provides a quadrature subcarrier signal cos$(w_0t+Pi/2)$. The four input signals S1-S4 are applied to mixer or multiplier circuits 13-16 respectively. The subcarrier signal from oscillator 11 is applied to mixers 13 and 15 while the quadrature subcarrier signals, from phase shifter 12 is applied to mixers 14 and 16. The outputs of mixers 13 and 14 are combined at summer 17, while the outputs of mixer 15 and 16 are combined at summer 18. The output of summer 17 is the $I_{tx}$ or in-phase signal for modulation on the RF carrier and the output of summer 18 is the $Q_{tx}$ or quadrature signal for quadrature modulation on the RF carrier. Mixers 13 and 14 and summer 17 constitute means for quadrature modulating first and second signals on a first subcarrier while mixers 15 and 16 and summer 18 constitute means for quadrature modulating third and fourth signals on a second subcarrier.

When it is desired to provide a pilot carrier signal for transmission with the quadrature modulated signals, a DC offset voltage, having a magnitude C, is applied to one of the summers 17 and 18. In this embodiment, DC voltage is applied to the summer 17. The outputs of summers 17 or 18 are provided to mixer or multipliers 20 and 21 respectively. A carrier frequency oscillator 22 provides an in phase carrier signal $\cos(w_c t)$ which is applied to the mixer 20 and to the input of a 90 degree phase shifter 23. The output of phase shifter 23, which is the quadrature carrier signal $\cos(w_c t + Pi/2)$, is applied to the mixer 21. The outputs of mixers 20 and 21 are provided to a summing circuit 24 to produce the combined transmit signal X(t). The X(t) signal can then be applied as through a bandpass filter and amplifier to an antenna, which constitute means for transmitting the quadrature modulated carrier, for radio transmission as is discussed subsequently in regard to FIG. 4. The mixers 20 and 21 and summer 24 constitute means for quadrature modulating the subcarriers onto a carrier.

Figure 2:
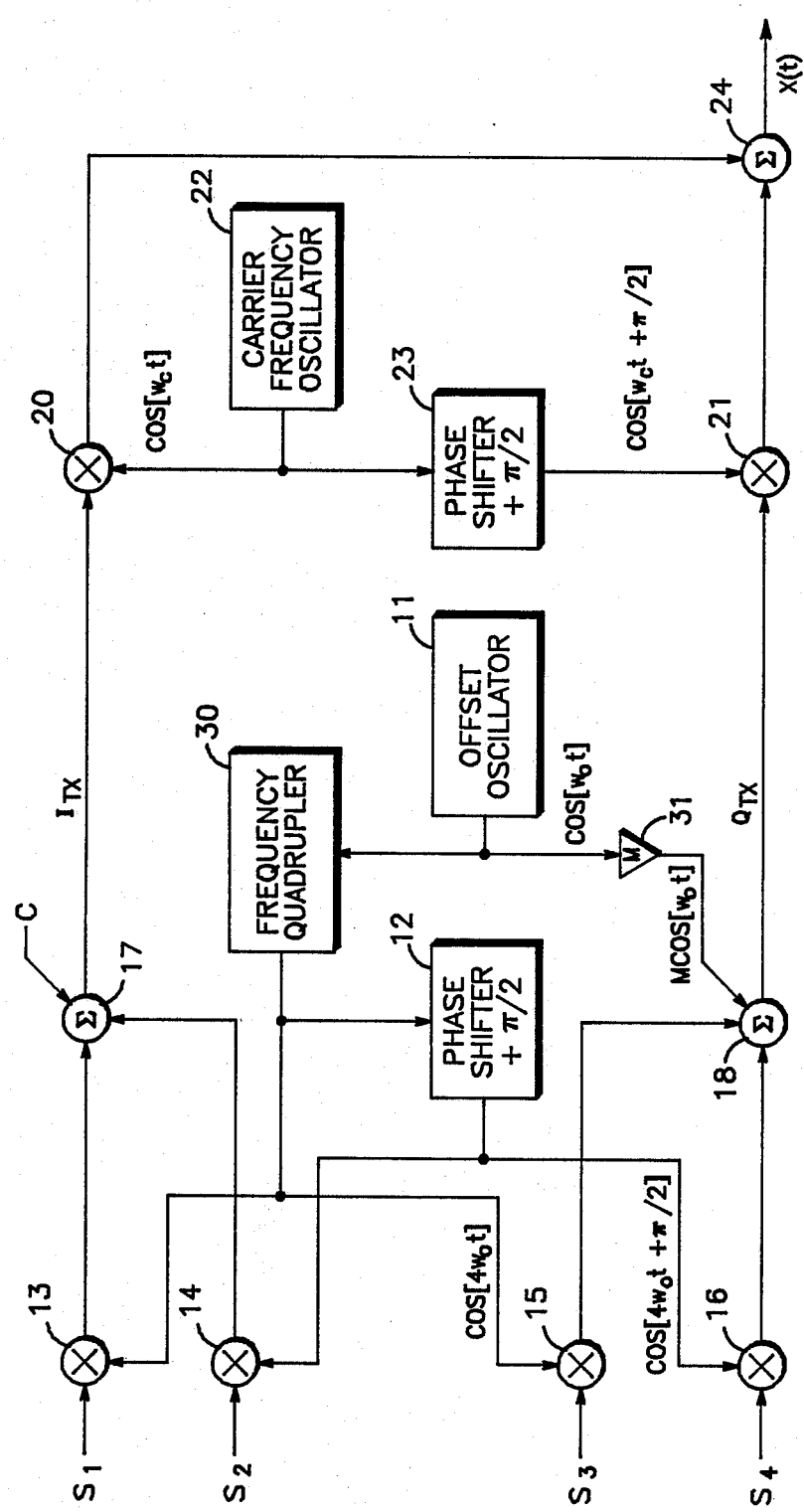
FIG. 2 is a block diagram of another quadrature amplitude modulation system in accordance with the present invention, particularly suitable for the transmission of digital signals.
Figure 5:
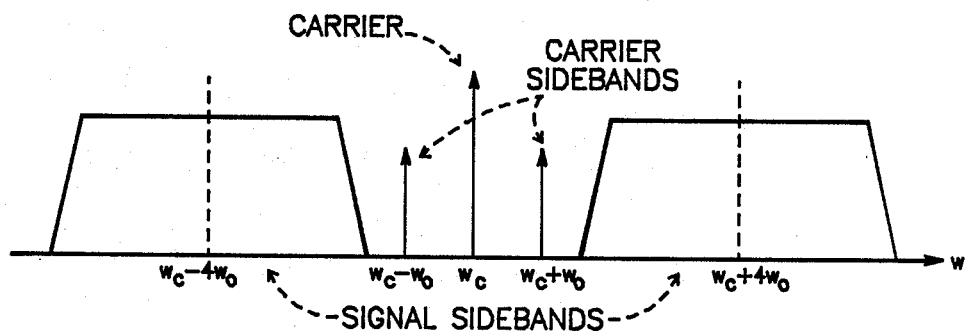
FIG. 5 is a graphical representation of the frequency spectrum of a quadrature modulated signal with a pilot carrier and bit sync signals in accordance with the present invention.

When digital signals are to be transmitted, it is desirable to provide a bit sync signal. The bit sync signal can be provided as sideband signals to the carrier signal and be located in the frequency spectrum between the quadrature signals. A system suitable for digital communication is illustrated in FIG. 2. The parts of FIG. 2 which are identical to the parts of FIG. 1 are indicated with the same reference numeral. The principal difference involves the offset oscillator arrangement. In this case, the offset oscillator 11 provides an output frequency $w_0$ which is one quarter of the oscillator frequency of FIG. 1. The frequency $w_0$ is chosen as an integer submultiple of the bit rate and in the preferred embodiment is one-fourth of the bit rate of each of the subchannels (one-sixteenth of the total bit rate). The output of offset oscillator 11 of FIG. 2 is applied to a frequency quadrupler 30 for application to the phase shifter 12 and mixers 1314 16 in a manner identical to FIG. 1. However, the lower frequency signal of offset oscillator 11 is also applied to a amplifier 31 having an amplification factor equal to M. Its output is applied, in this case, to the summer 18 constituting means for summing a sync signal with one of the subcarriers. It will be understood that the output of amplifier 31 could be applied to the summer 17 and the carrier signal C applied to the summer 18 if desired or both to the same summer. The $I_{tx}$ and $Q_{tx}$ signals are then quadrature modulated on the carrier frequency as in FIG. 1. The output signal X(t) includes not only the quadrature modulated signal components but also a carrier and bit sync sidebands as illustrated in FIG. 5. The S1-S4 signals are preferably predetermined pulses P(t) read from a memory ROM, such as it is disclosed in co-pending U.S Pat. No. 4,737,969, issued Apr. 12, 1988, and owned by the assignee of this invention, the disclosure of which is incorporated by reference as if fully set out herein.

When using stored pulses, the mixing or multiplication step of mixers 13-16 can be eliminated by reading from memory pulses representative of the product of the multiplication or mixing, provided the bit rate and subcarrier frequency are related by an integer ratio.

Figure 3:
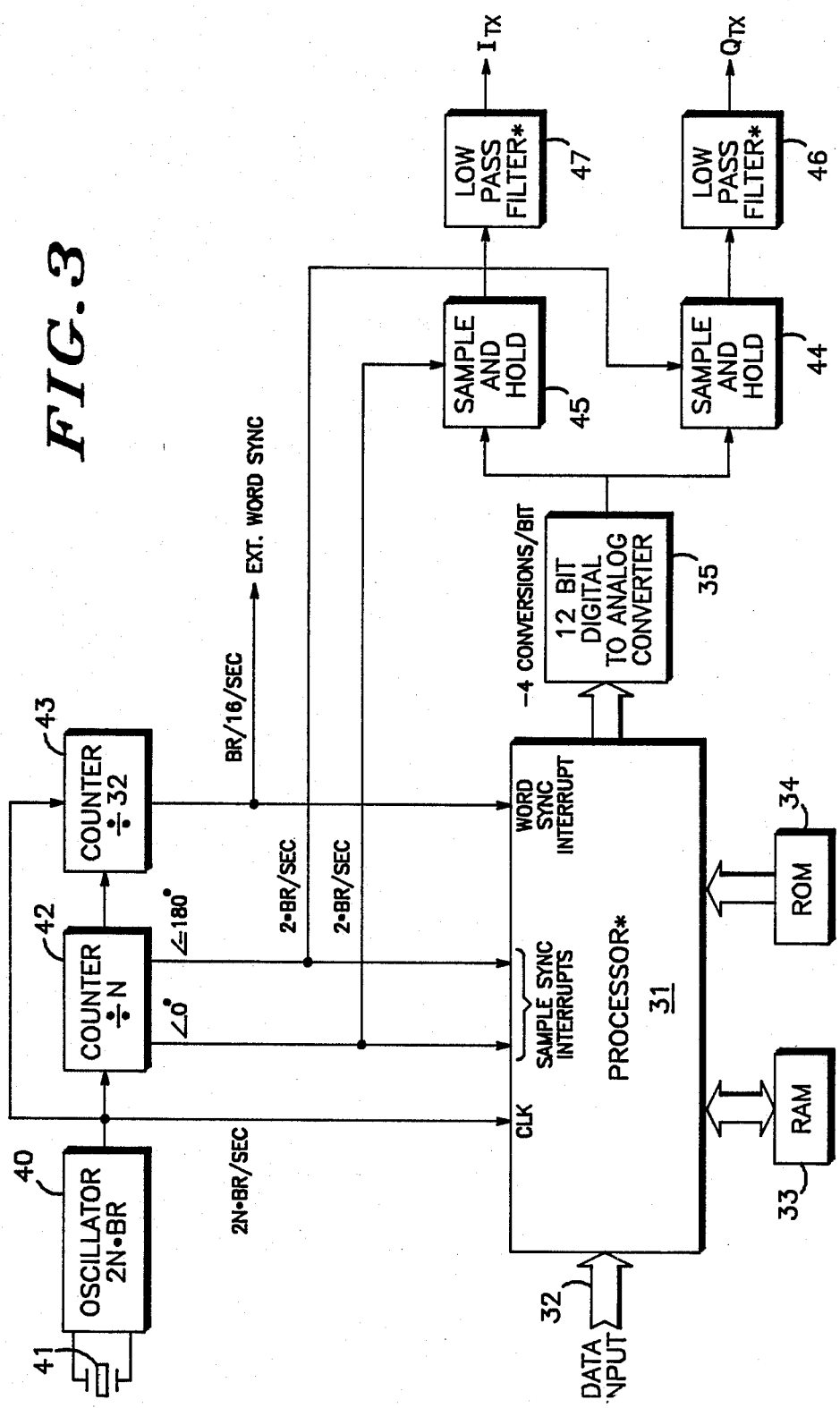
FIG. 3 is a schematic block diagram of another quadrature amplitude modulation system in accordance with the present invention, which utilizes predetermined pulse waveforms.

FIG. 3 illustrates a microprocessor based system for providing the $I_{tx}$ and $Q_{tx}$ signals. In this case a digital signal processor 31, constituting processor means, includes a data input 32 for receiving the digital data to be transmitted. The digital data can be four independent digital data stream or preferably a single data stream can be subdivided as the S1-S4 signals. The processor 31 includes RAM 33 and ROM 34. The ROM 34 includes the preprogrammed waveforms which are be summed to provide the $I_{tx}$ and $Q_{tx}$ signals. The $I_{tx}$ signal is produced by adding an S1 stored pulse corresponding to $P(t-1) \cos(4w_0 t)$ of FIG. 6F to an S2 signal corresponding to $P(t) \cos(4w_0 t + Pi/2)$ of FIG. 6E along with the carrier amplitude constant C. Similarly for the $Q_{tx}$ signal, the S3 signal $P(t-3) \cos(4w_0 t)$ and the S4 stored pulse $P(t) \cos(4w_0 t + Pi/2)$ of FIG. 6G are added along with the bit sync signal $M \cos(4w_0 t)$. The process continues similarly for each successive set of 4 bits. It will be appreciated that for a binary system it is only necessary to store one prototype pulse. It is negated to represent the other binary signal. Also as illustrated in FIGS. 6E-6H, the same waveform is used on each channel S1-S4 differing only in phase or time. While the preferred embodiment utilizes binary or two level signals, multilevel (e.g. 8 level) signals could be provided on each channel to increase information throughput. It would then be necessary to store four pulses for an 8 level signal since their negatives would represent the other four levels which can be easily computed by the processor 31.

The output of processor 31 is applied to a 12 bit D/A converter 35. An oscillator circuit 40, having a crystal, 41 provides an output frequency equal to $2N \times$ Bit Rate which is applied to the clock input of processor 31 and the clock inputs of counters 42 and 43. Counter 42, constituting a divide by N counter, provides 0 degree and a $-180$ degree outputs, which are applied to the processor 31 as a sample sync interrupts and are also applied to sample and hold circuits 44 and 45, respectively. These are at twice the bit rate to permit the single D/A converter 35 to be used for both the $I_{tx}$ and $Q_{tx}$ signals. The inputs of sample and hold circuits 44 and 45 are connected to the output of the D/A converter 35. Low pass filters 46 and 47 are connected to the outputs of the sample and hold circuits 44 and 45 with their outputs providing the $Q_{tx}$ and $I_{tx}$ transmit signals. These are then quadrature modulated on the carrier frequency $w_c$ as in FIG. 1 and 2. In this embodiment, a Texas Instruments TMS 32020 Digital Signal Processor can be utilized. The object code including the prototype pulse information as stored in ROM 34 is given in Table 1, which is appended hereto.

Figure 4:
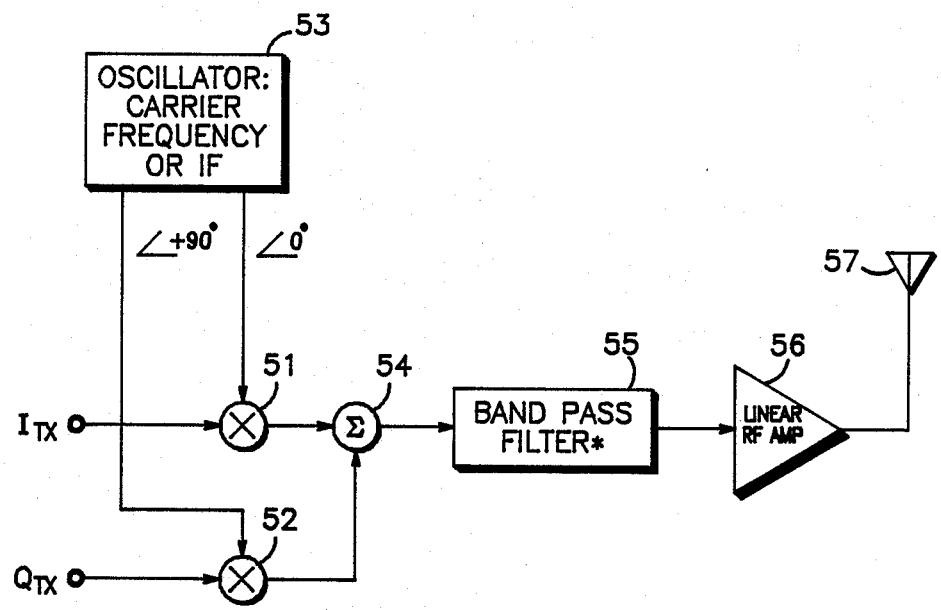
FIG. 4 is a schematic block diagram of a the transmitter backend for use with the system of FIG. 3.

Referring now to FIG. 4, the radio backend for quadrature modulation of the $I_{tx}$ and $Q_{tx}$ signals of FIG. 3 onto a carrier, is illustrated. The $I_{tx}$ and $Q_{tx}$ signals are applied to mixers 51 and 52 respectively which correspond to the mixers 20 and 21 of FIGS. 1 and 2. The carrier and 90 degrees quadrature carrier signals are provided to mixers 51 and 52 respectively, as by carrier frequency oscillator 53 which corresponds to the carrier frequency oscillator 22 and phase shifter 23. The output of mixers 51 and 52 are applied to a summer 54 whose output provides the transmit signal X(t).

The backend of the transmitter is identical to that to be used in the circuits of FIG. 1 and FIG. 2. The output of the summer 54 in this case, or the summer 24 of FIGS. 1 and 2, is applied to a bandpass filter 55 having its output applied to a linear RF amplifier 56, the output of which is transmitted via antenna 57. The transmitted signal includes the input signals modulated on subcarriers, the center carrier signal and the two carrier sideband bit sync signals as illustrated in FIG. 5. The carrier and bit sync signals are useful when demodulating the received transmitted signal in order to compensate for selective fading that can occur over a radio path.

In operation, a first pair of signals are quadrature modulated onto a first subcarrier while a second pair of signals are quadrature modulated onto a second subcarrier. The two quadrature modulated subcarriers are then quadrature modulated onto the carrier resulting in the information carrying components signal being spaced from the carrier frequency. A pilot carrier signal and bit sync signals can be inserted between sidebands carrying the twice quadrature modulated information signals. This provides a spectrally efficient signal capable of being successfully transmitted over an unstable channel. Consequently, it can be used in applications, such as land mobile radio where conventional quadrature amplitude modulation cannot be reliably applied.

TABLE 1

```
K0000XMT II.590000BFF80B0020BFF80B0599BFF80B059990020BCE02BCE077F187F    XMT II.1
BC800BCE08B5589BC103BD001BFFFFB60A0BD001BFFC1B60A0BCA00B6B80BC8067F0E7F   XMT II.2
BCA01B604EB604FB8050B9F50BF880B014BBD001B07CFB604CBD001B00C5B604D7F130F   XMT II.3
B204EB104FB604EBF180B004FBCA19B604EBC104BD001BFFC2B60B0BCE00BCE1F7F0F1F   XMT II.4
BC104BD001BFFC2B60B0BFF80B0051BCE00BCE1FBD001B065DB604CBD001B01EE7F101F   XMT II.5
B604DBCE00BCE1FBD001B03EBB604CBD001B021BB604DBCE00BCE1FBD001B01357F10BF   XMT II.6
B604CBD001B00FDB604DBCE00BCE1FBD001BFF03B604CBD001BFECBB604DBCE007F0C2F   XMT II.7
BCE1FBD001BFDE8B604CBD001BFC15B604DBCE00BCE1FBD001BFE12B604CBD0017F0B9F   XMT II.8
BF9A3B604DBCE00BCE1FBD001BFF3BB604CBD001BF831B604DBCE00BCE1FBD0017F0B3F   XMT II.9
B00C5B604CBD001BF831B604DBCE00BCE1FBD001B01EEB604CBD001BF9A3B604D7F0FBF   XMT 1110
BCE00BCE1FBD001B021BB604CBD001BFC15B604DBCE00BCE1FBD001B00FDB604C7F0E6F   XMT 1111
BD001BFECBB604DBCE00BCE1FBD001BFECBB604CBD001B00FDB604DBCE00BCE1F7F07FF   XMT 1112
BD001BFC15B604CBD001B021BB604DBCE00BCE1FBD001BF9A3B604CBD001B01EE7F104F   XMT 1113
B604DBCE00BCE1FBD001BF831B604CBD001B00C5B604DBCE00BCE1FBD001BF8317F0EDF   XMT 1114
B604CBD001BFF3BB604DBCE00BCE1FBD001BF9A3B604CBD001BFE12B604DBCE007F0C9F   XMT 1115
BCE1FBD001BFC15B604CBD001BFDE8B604DBCE00BCE1FBD001BFECBB604CBD0017F097F   XMT 1116
BFF03B604DBCE00BCE1FBD001B00FDB604CBD001B0135B604DBCE00BCE1FBD0017F0E7F   XMT 1117
B021BB604CBD001B03EBB604DBCE00BCE1FBD001B01EEB604CBD001B065DB604D7F114F   XMT 1118
BCE00BCE1FBD001B00C5B604CBD001B07CFB604DBCE00BCE1FBD001BFF3BB604C7F0C1F  XMT 1119
BD001B07CFB604DBCE00BCE1FBD001BFE12B604CBD001B065DB604DBCE00BCE1F7F0CCF  XMT 1120
BD001BFDE8B604CBD001B03EBB604DBCE00BCE1FBD001BFF03B604CBD001B01357F0F3F  XMT 1121
B604DBCE00BCE1FBD001B0135B604CBD001BFF03B604DBCE00BCE1FBD001B03EB7F0E7F   XMT 1122
B604CBD001BFDE8B604DBCE00BCE1FBD001B065DB604CBD001BFE12B604DBCE007F0D7F   XMT 1123
BCE1FBD001B07CFB604CBD001BFF3BB604DBCE00BCE1FBFF80B0036BD100B02007F0DFF   XMT 1124
BCB63BFCA0B059DBCE05BC806BD100B0300BCB1FBFCA0B0601B9E50BF980B01707F0F0F   XMT 1125
BD100B0320BCB0ABFCA0B064DBD100B032BBCB0ABFCA0B0658BD100B0336BCB0A7F101F   XMT 1126
BFCA0B0663BD100B0341BCB0ABFCA0B066EBFF80B0B0184BD1C0320BCB0ABFCA07F0EDF  XMT 1127
B0621BD100B032BBCB0ABFCA0B062CBD100B0336BCB0ABFCA0637BD100B03417F131F  XMT 1128
BCB0ABFCA0B0642BCA00BA000BD100B0329BCB09B5D90BFF5ABD100B0334BCB097F0FCF   XMT 1129
B5D90BFF46BCE15B604CBCA00BA000BD100B033FBCB09B5D90BFF32BD100B034A7F0F8F   XMT 1130
BCB09B5D90BFF1EBCE15B0017B604DB204EB104FB604EBF180B01B4BCA19B604E7F0F1F   XMT 1131
BC104BD001BFFC2B60B0BCE00BCE1FBC104BD001BFFC2B60B0BFF80B01B6BCE007F0DBF   XMT 1132
BCE1FBCA00BA000BD100B0329BCB09B5D90BFF50BD100B0334BCB09B5D90BFF3C7F0E6F   XMT 1133
BCE15B604CBCA00BA000BD100B033FBCB09B5D90BFF2BBD100B034ABCB09B5D907F0FBF   XMT 1134
BFF14BCE15B001B604DBCE00BCE1FBCA00BA000BD100B0329BCB09B5D90BFF467F0E4F    XMT 1135
BD100B0334BCB09B5D90BFF32BCE15B604CBCA00BA000BD100B033FBCB09B5D907F10EF   XMT 1136
BFF1EBD100B034ABCB09B5D90BFF0ABCE15B0019B604DBCE00BCE1FBCA00BA0007F0C1F   XMT 1137
BD100B0329BCB09B5D90BFF3CBD100B0334BCB09B5D90BFF2BBCE15B604CBCA007F0E6F   XMT 1138
BA000BD100B033FBCB09B5C90BFF14BD100B034ABCB09B5C90BFF00BCE15B001A7F105F   XMT 1139
B604DB203AB6036B2045B6041BCE00BCE1FBCA00BA000BD100B0329BCB09B5D907F147F   XMT 1140
BFF32BD100B0334BCB09B5D90BFF1EBCE15B604CBCA00BA000BD100B033FBCB097F0EEF   XMT 1141
B5D90BFF5ABD100B0334BCB09B5D90BFF46BCE15B001BB604DBCE00BCE1FBCA007F0AEF   XMT 1142
BA000BD100B0329BCB09B5D90BFF2BBD100B0334BCB09B5D90BFF14BCE15B604C7F10AF   XMT 1143
BCA00BA000BD100B033FBCB09B5D90BFF50BD100B0334ABCB09B5D90BFF3CBCE157F0DBF  XMT 1144
B001CB604DBCE00BCE1FBCA00BA000BD100B0329BCB09B5D90BFF1EBD100B03347F10DF   XMT 1145
BCB09B5D90BFF0ABCE15B604CBCA00BA000BD100B033FBCB09B5D90BFF46BD1007F0D6F   XMT 1146
B034ABCB09B5D90BFF32BCE15B001DB604DBCE00BCE1FBCA00BA000BD100B03297F0F6F   XMT 1147
BCB09B5C90BFF14BD100B0334BCB09B5C90BFF00BCE15B604CB2024B6020B202F7F120F   XMT 1148
B602BBCA00BA000BD100B033FBCB09B5D90BFF3CBD100B034ABCB09B5D90BFF2B7F0EAF   XMT 1149
BCE15B001EB604DBCE00BCE1FBCA00BA000BD100B0329BCB09B5D90BFF5ABD1007F0E7F   XMT 1150
B0334BCB09B5D90BFF46BCE15B604CBCA00BA000BD100B033FBCB09B5D90BFF327F0EDF   XMT 1151
BD100B034ABCB09B5D90BFF1EBCE15B001FB604DBCE00BCE1FBCA00BA000BD1007F0DCF   XMT 1152
B0329BCB09B5D90BFF50BD100B0334BCB09B5D90BFF3CBCE15B604CBCA00BA0007F0EFF   XMT 1153
BD100B033FBCB09B5D90BFF2BBD100B034ABCB09B5D90BFF14BCE15B0000B604D7F0FEF   XMT 1154
BCE00BCE1FBCA00BA000BD100B0329BCB09B5D90BFF46BD100B0334BCB09B5D907F0FBF  XMT 1155
```

```
BFF32BCE15B604CBCA00BA000BD100B033FBCB09B5D90BFF1EBD100B034ABCB097F0E0F    XMT I156
B5D90BFF0ABCE15B0001B604DBCE00BCE1FBCA00BA000BD100B0329BCB09B5D907F0F4F    XMT I157
BFF3CBD100B0334BCB09B5D90BFF28BCE15B604CBCA00BA000BD100B033FBCB097F0E9F    XMT I158
B5C90BFF14BD100B034ABCB09B5C90BFF00BCE15B0002B604DB203AB6036B20457F137F    XMT I159
B6041BCE00BCE1FBCA00BA000BD100B0329BCB09B5D90BFF32BD100B0334BCB097F117F    XMT I160
B5D90BFF1EBCE15B604CBCA00BA000BD100B033FBCB09B5D90BFF5ABD100B034A7F0DBF    XMT I161
BCB09B5D90BFF46BCE15B0003B604DBCE00BCE1FBCA00BA000BD100B0329BCB097F0EDF    XMT I162
B5D90BFF28BD100B0334BCB09B5D90BFF14BCE15B604CBCA00BA000BD100B033F7F106F    XMT I163
BCB09B5D90BFF50BD100B034ABCB09B5D90BFF3CBCE15B0004B604DBCE00BCE1F7F0B8F    XMT I164
BCA00BA000BD100B0329BCB09B5D90BFF1EBD100B0334BCB09B5D90BFF0ABCE157F0EBF    XMT I165
B604CBCA00BA000BD100B033FBCB09B5D90BFF46BD100B034ABCB09B5D90BFF327F0FBF    XMT I166
BCE15B0005B604DBCE00BCE1FBCA00BA000BD100B0329BCB09B5C90BFF14BD1007F10AF    XMT I167
B0334BCB09B5C90BFF00BCE15B604CB2024B6020B202FB602BBCA00BA000BD1007F151F    XMT I168
B033FBCB09B5D90BFF3CBD100B034ABCB09B5D90BFF28BCE15B0006B604DBCE007F0D4F    XMT I169
BCE1FBCA00BA000BD100B0329BCB09B5D90BFF5ABD100B0334BCB09B5D90BFF467F0E1F    XMT I170
BCE15B604CBCA00BA000BD100B033FBCB09B5D90BFF32BD100B034ABCB09B5D907F100F    XMT I171
BFF1EBCE15B0007B604DBCE00BCE1FBCA00BA000BD100B0329BCB09B5D90BFF507F0DAF    XMT I172
BD100B0334BCB09B5D90BFF3CBCE15B604CBCA00BA000BD100B033FBCB09B5D907F0DF    XMT I173
BFF28BD100B034ABCB09B5D90BFF14BCE15B0008B604DBCE00BCE1FBCA00BA0007F0DBF   XMT I174
BD100B0329BCB09B5D90BFF46BD100B0334BCB09B5D90BFF32BCE15B604CBCA007F0F7F   XMT I175
BA000BD100B033FBCB09B5D90BFF1EBD100B034ABCB09B5D90BFF0ABCE15B00097F0EAF   XMT I176
B604DBCE00BCE1FBCA00BA000BD100B0329BCB09B5D90BFF3CBD100B0334BCB097F0F3F   XMT I177
B5D90BFF28BCE15B604CBCA00BA000BD100B033FBCB09B5C90BFF14BD100B034A7F0F9F   XMT I178
BCB09B5C90BFF00BCE15B000AB604DB203AB6036B2045B6041BCE00BCE1FBCA007F111F   XMT I179
BA000BD100B0329BCB09B5D90BFF32BD100B0334BCB09B5D90BFF1EBCE15B604C7F0EEF   XMT I180
BCA00BA000BD100B033FBCB09B5D90BFF5ABD100B034ABCB09B5D90BFF46BCE157F0D6F   XMT I181
B000BB604DBCE00BCE1FBCA00BA000BD100B0329BCB09B5D90BFF28BD100B03347F11BF   XMT I182
BCB09B5D90BFF14BCE15B604CBCA00BA000BD100B033FBCB09B5D90BFF50BD1007F0E7F   XMT I183
B034ABCB09B5D90BFF3CBCE15B000CB604DBCE00BCE1FBCA00BA000BD100B03297F0E7F   XMT I184
BCB09B5D90BFF1EBD100B0334BCB09B5D90BFF0ABCE15B604CBCA00BA000BD1007F0DCF   XMT I185
B033FBCB09B5D90BFF46BD100B034ABCB09B5D90BFF32BCE15B000DB604DBCE007F0D7F   XMT I186
BCE1FBCA00BA000BD100B0329BCB09B5C90BFF14BD100B0334BCB09B5C90BFF007F0EEF   XMT I187
BCE15B604CB2024B6020B202FB602BBCA00BA000BD100B033FBCB09B5D90BFF3C7F128F   XMT I188
BD100B034ABCB09B5D90BFF28BCE15B000EB604DBCE00BCE1FBCA00BA000BD1007F0EAF   XMT I189
B0329BCB09B5D90BFF5ABD100B0334BCB09B5D90BFF46BCE15B604CBCA00BA0007F0EAF   XMT I190
BD100B033FBCB09B5D90BFF32BD100B034ABCB09B5D90BFF1EBCE15B000FB604D7F0DCF   XMT I191
BCE00BCE1FBCA00BA000BD100B0329BCB09B5D90BFF50BD100B0334BCB09B5D907F100F   XMT I192
BFF3CBCE15B604CBCA00BA000BD100B033FBCB09B5D90BFF28BD100B034ABCB097F0DBF   XMT I193
B5D90BFF14BCE15B0010B604DBCE00BCE1FBCA00BA000BD100B0329BCB09B5D907F100F   XMT I194
BFF46BD100B0334BCB09B5D90BFF32BCE15B604CBCA00BA000BD100B033FBCB097F0FAF   XMT I195
B5D90BFF1EBD100B034ABCB09B5D90BFF0ABCE15B0011B604DBCE00BCE1FBCA007F0B8F   XMT I196
BA000BD100B0329BCB09B5D90BFF3CBD100B0334BCB09B5D90BFF28BCE15B604C7F0F9F   XMT I197
BCA00BA000BD100B033FBCB09B5C90BFF14BD100B034ABCB09B5C90BFF00BCE1F7F0F3F   XMT I198
B0012B604DB203AB6036B2045B6041BCE00BCE1FBCA00BA000BD100B0329BCB097F166F   XMT I199
B5D90BFF32BD100B0334BCB09B5D90BFF1EBCE15B604CBCA00BA000BD100B033F7F0FAF  XMT I1100
BCB09B5D90BFF5ABD100B034ABCB09B5D90BFF46BCE15B0013B604DBCE00BCE1F7F0B3F  XMT I1101
BCA00BA000BD100B0329BCB09B5D90BFF28BD100B0334BCB09B5D90BFF14BCE157F103F  XMT I1102
B604CBCA00BA000BD100B033FBCB09B5D90BFF50BD100B034ABCB09B5D90BFF3C7F0ECF  XMT I1103
BCE15B0014B604DBCE00BCE1FBCA00BA000BD100B0329BCB09B5D90BFF1EBD1007F0FBF  XMT I1104
B0334BCB09B5D90BFF0ABCE15B604CBCA00BA000BD100B033FBCB09B5D90BFF467F0E1F  XMT I1105
BD100B034ABCB09B5D90BFF32BCE15B0015B604DBCE00BCE1FBCA00BA000BD1007F0EFF  XMT I1106
B0329BCB09B5C90BFF14BD100B0334BCB09B5C90BFF00BCE15B604CB2024B60207F12CF  XMT I1107
B202FB602BBCA00BA000BD100B033FBCB09B5D90BFF3CBD100B034ABCB09B5D907F106F  XMT I1108
BFF28BCE15B0016B604DBCE00BCE1FBFF80B0184BE54CBE64DBE74DBCE26B00007F0B6F  XMT I1109
BFFFEB000BBFFDDB0065BFD64BFF49B003DBFFEBB0005B0000B0001BFFFEB00077F0ACF  XMT I1110
BFFE7BFCC1B001BBFFF9B0002BFFFFB0000B0005BFFEDB0037BF50BFE77B00787F095F   XMT I1111
BFFD7B000DBFFFDB0000B0003BFFF5B001FBFF93B011B0014BFFFB0002B00007F10AF   XMT I1112
B0001BFFFAB0016BFFBEB00E0B0285BFF89B0029BFFF3B0003B0002BFFF3B002E7F0EFF  XMT I1113
BFF7CB0220B01E0BFF7AB002FBFFF3B0002B0002BFFBB001ABFFB6B01D8B002B7F0D9F   XMT I1114
BFFE4B0009BFFFEB0000BFFFFB0006BFFECB003ABFFC3BFF13B0043BFFE9B00077F07AF  XMT I1115
BFFFFBFFFEB0000BBFFDDB0065BFD64BFF49B003DBFFEBB0005B0000B0001BFFFE7F05BF XMT I1116
B0007BFFE7BFCC1B001BFFF9B0002BFFFEB5BFFD7BFFCABFFBFFBFB67EFF6F           XMT I1117
BFFB1BFFAEBFFAFBFFB2BFFB9BFFC3BFFCEBFFDCBFFFBFFFB0000B001BB00297EFB4F   XMT I1118
B0036B0041B004AB004FB0052B0051B004EB0047B003DB0032B0024B0015B00057F214F  XMT I1119
BFFF5BFFFFB0001BFFFFB0001BFFFFB0001BFFFFB0001BFFFFB0001B0000B00017F0AAF  XMT I1120
BFFFFBFFFFB0001B0001BFFFFBFFFFB0001B0001BFFFFB0000BFFFFB0001B00017F099F  XMT I1121
BFFFFBFFFFB0001B0001BFFFFBFFFFB0001B0000B0001BFFFFB0001BFFFFB00017F099F  XMT I1122
BFFFFB0001BFFFFB0001BFFFFB0000B0000BFFFFB0000B0001BFFFFB0000BFFFFB00017F09BF XMT I1123
BFFFFB0000BFFFFB0000B0000BFFFFB0000B0001B0000BFFFFB0000B00017F14CF       XMT I1124
B0000B0000B0000BFFFFB0001B0000B0000BFFFFB0001B0000B0000BFFFFB00007F1A5F  XMT I1125
BFFFFB0001B0000B0001BFFFFB0001B0000B0001BFFFFB0001B00007F3A6F            XMT I1126
:    XMT II.5   08-25-87   10:15:36    ASM32020 PC 1.0 86.036             XMT I1127
```

© Motorola, Inc. 1987

I claim as my invention:

1. A method of transmitting a quadrature amplitude modulated signal comprising the steps of:
   quadrature modulating first and second signals onto a first subcarrier, quadrature modulating third and fourth signals onto a second subcarrier,
   quadrature modulating said first and second quadrature modulated subcarriers onto a carrier, and
   transmitting said quadrature modulated carrier, 2. A method of transmitting a quadrature amplitude modulated signal comprising the steps of;
   quadrature modulating first and second signals onto a first subcarrier
   quadrature modulating third and fourth signals onto a second subcarrier,
   providing a DC component with one of said quadrature modulated subcarriers for producing a pilot carrier,
   quadrature modulating said quadrature first and second quadrature modulated subcarriers onto a carrier, and
   transmitting said quadrature modulated carrier.

3. A method of transmitting quadrature amplitude modulated signal as defined in claim 1, comprising the further step of providing a bit sync signal with one of said quadrature modulated subcarriers.

4. A method as defined in claim 3, in which the signals are digital signals having a predetermined bit rate and the bit sync signal has a frequency that is an integral multiple of said bit rate.

5. A method of transmitting a quadrature amplitude modulated signal, comprising:
   reading from memory first and second prototype pulses each including a subcarrier component,
   summing said first and second prototype pulses to produce a first quadrature modulated subcarrier,
   reading from memory third and fourth prototype pulses each including a subcarrier component,
   summing said third and fourth prototype pulses to produce a second quadrature modulated subcarrier,
   quadrature modulating a carrier with said first and second quadrature modulated subcarriers, and
   transmitting said quadrature modulated carrier.

6. A method of transmitting a quadrature amplitude modulated signal comprising:
   reading from memory first and second prototype pulses each including a subcarrier component,
   summing said first and second prototype pulses to produce a first quadrature modulated subcarrier,
   reading form memory third and fourth prototype pulses each including a subcarrier component,
   summing said third and fourth prototype pulses to produce a second quadrature modulated subcarrier,
   quadrature modulating a carrier with said first and second quadrature modulated subcarriers,
   summing an offset with one of said summed pulses prior to quadrature modulating said carrier, and
   transmitting said quadrature modulated carrier, 7. A method of transmitting a quadrature amplitude modulated signals defined in claim 5 including the further step of summing a sync signal with one of said summed pulses prior to quadrature modulating said carrier.

8. An apparatus for transmitting quadrature modulated signals comprising:
   means for quadrature modulating first and second signals on a first subcarrier,
   means for quadrature modulating third and fourth signals onto a second subcarrier,
   means for quadrature modulating said first and second subcarriers onto a carrier, and
   means for transmitting said quadrature modulated carrier.

9. An apparatus for transmitting quadrature modulated signals comprising:
   means for quadrature modulating first and second signals on a first subcarrier,
   means for quadrature modulating third and fourth signals onto a second subcarrier,
   means for summing a sync signal with one of said subcarriers,
   means for quadrature modulating said first and second subcarriers onto a carrier, and
   means for transmitting said quadrature modulated carrier.

10. An apparatus as defined in claim 9, in which a processor means is used for quadrature modulating said first and second signals and said third and fourth signals.

11. An apparatus as defined in claim 10, in which said processor means includes a memory means containing a prototype pulse having a subcarrier component, and said first and second subcarriers produced by summing prototype pulses in said microprocessor means.

* * * * *